US011727851B2

(12) United States Patent
Hwang et al.

(10) Patent No.: US 11,727,851 B2
(45) Date of Patent: Aug. 15, 2023

(54) GATE DRIVER AND DISPLAY DEVICE INCLUDING THE SAME

(71) Applicant: SAMSUNG DISPLAY CO., LTD., Yongin-si (KR)

(72) Inventors: Junghwan Hwang, Seongnam-si (KR); Doo-young Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/703,420

(22) Filed: Mar. 24, 2022

(65) Prior Publication Data

US 2022/0358873 A1  Nov. 10, 2022

(30) Foreign Application Priority Data

May 7, 2021  (KR) ........................ 10-2021-0059076

(51) Int. Cl.
*G09G 3/3266* (2016.01)
*G09G 3/3225* (2016.01)
*G09G 3/20* (2006.01)

(52) U.S. Cl.
CPC ... *G09G 3/2092* (2013.01); *G09G 2300/0426* (2013.01); *G09G 2310/0275* (2013.01)

(58) Field of Classification Search
None
See application file for complete search history.

(56) References Cited

U.S. PATENT DOCUMENTS

| | | | |
|---|---|---|---|
| 9,589,519 B2 | 3/2017 | Hwang et al. | |
| 11,127,339 B2 * | 9/2021 | Kim | G09G 3/2092 |
| 2015/0287392 A1 * | 10/2015 | Kim | G09G 3/3677 |
| | | | 327/109 |
| 2016/0210926 A1 * | 7/2016 | Amino | G11C 19/28 |
| 2018/0337682 A1 * | 11/2018 | Takasugi | H03K 21/18 |
| 2020/0349892 A1 * | 11/2020 | Park | G09G 3/3275 |

FOREIGN PATENT DOCUMENTS

KR  10-2020-0135633  12/2020

* cited by examiner

*Primary Examiner* — Sepehr Azari
(74) *Attorney, Agent, or Firm* — F. Chau & Associates, LLC

(57) ABSTRACT

A gate driver includes active stages that output gate signals to a display part and pre-stages connected to the active stages to output carry signals to the active stages. The pre-stages include a first pre-stage and a second pre-stage. The second pre-stage includes a Q node compensator that receives a clock signal from the first pre-stage and compensates for a voltage of a Q node based on the clock signal of the first pre-stage. The Q node compensator includes a feedback transistor that diode-connects a feedback input terminal, which receives the clock signal of the first pre-stage, to a feedback node of the second pre-stage. The feedback transistor includes a first electrode, a second electrode, and a third electrode, where the first electrode is connected to the feedback input terminal, the second electrode is connected to the first electrode, and the third electrode is connected to the feedback node.

21 Claims, 11 Drawing Sheets

GATE DRIVER AND DISPLAY DEVICE INCLUDING THE SAME

CROSS-REFERENCE

This application claims priority under 35 U.S.C. § 119 to Korean Patent Application No. 10-2021-0059076 filed on May 7, 2021 in the Korean Intellectual Property Office (KIPO), the entire disclosure of which is incorporated by reference herein.

FIELD

The present disclosure relates to a gate driver and a display device including the gate driver. More particularly, the present disclosure relates to a gate driver including a plurality of pre-stages and a display device including the gate driver.

DISCUSSION OF RELATED ART

In general, a display device includes a display panel and a display panel driver. The display panel includes a plurality of gate lines and a plurality of data lines. The display panel driver includes a gate driver configured to provide gate signals to the gate lines and a data driver configured to provide data voltages to the data lines.

The gate driver may output the gate signals by using a plurality of stages integrated on the display panel. The gate driver may include an active stage configured to output the gate signal to the display panel and a pre-stage that does not output the gate signal to the display panel.

The pre-stage may pre-charge a Q node based on a vertical start signal. When leakage currents of transistors are passed in the pre-stage, a voltage of the Q node might not be held. When the voltage of the Q node is not held, the active stage may output an abnormal sensing signal and an abnormal gate signal.

SUMMARY

An embodiment of the present disclosure may provide a gate driver capable of holding a substantially constant voltage of a Q node during a holding time by feeding back a carry signal between pre-stages.

An embodiment of the present disclosure may provide a display device including the gate driver.

According to an embodiment of the present disclosure, a gate driver may include a plurality of active stages configured to output gate signals to a display part and a plurality of pre-stages connected to the active stages to output carry signals to the active stages. The pre-stages may include a first pre-stage and a second pre-stage. The second pre-stage may include a Q node compensator configured to receive a clock signal from the first pre-stage and to compensate for a voltage of a Q node based on the clock signal of the first pre-stage. The Q node compensator may include a feedback transistor configured to diode-connect a feedback input terminal, which is configured to receive the clock signal of the first pre-stage, to a feedback node of the second pre-stage.

In an embodiment, the feedback transistor may include a first electrode, a second electrode, and a third electrode, the first electrode being connected to the feedback input terminal, the second electrode being connected to the first electrode, and the third electrode being connected to the feedback node.

In an embodiment, the clock signal of the first pre-stage may be one of a carry signal of the first pre-stage, a sensing signal of the first pre-stage, or a gate signal of the first pre-stage.

In an embodiment, the second electrode of the feedback transistor may be a gate electrode.

In an embodiment, the Q node compensator may be configured to adjust a level of a voltage applied to the feedback node to reduce a drain-source voltage of at least one of transistors configured to connect the feedback node to the Q node.

In an embodiment, the second pre-stage may include a Q node charger configured to receive a vertical start signal to charge the Q node, a Q node stabilizer configured to receive a carry signal of the active stage to stabilize the Q node, and an inverter configured to generate an inverting signal based on the voltage of the Q node.

In an embodiment, the feedback node of the second pre-stage may be connected to the Q node charger, the Q node stabilizer, and the inverter.

In an embodiment, the second pre-stage may include a transistor stabilizer configured to stabilize a plurality of transistors connected to the feedback node based on a transistor stabilization signal. The transistor stabilizer may include a first transistor stabilization transistor and a second transistor stabilization transistor. The first transistor stabilization transistor may include a first electrode connected to the second transistor stabilization transistor, a second electrode connected to the Q node, and a third electrode connected to the feedback node. The second transistor stabilization transistor may include a first electrode to which a gate high voltage is applied, a second electrode connected to the Q node, and a third electrode connected to the first transistor stabilization transistor.

In an embodiment, the Q node charger may include a first charging transistor and a second charging transistor. The second charging transistor may include a first electrode configured to receive the vertical start signal, a second electrode connected to the first electrode, and a third electrode connected to the first charging transistor. The first charging transistor may include a first electrode connected to the second charging transistor, a second electrode connected to the first electrode of the second charging transistor, and a third electrode connected to the Q node.

In an embodiment, the Q node stabilizer may include a first stabilization transistor and a second stabilization transistor. The first stabilization transistor may include a first electrode connected to the second stabilization transistor, a second electrode to which one of next carry signals is applied, and a third electrode connected to the Q node. The second stabilization transistor may include a first electrode to which a first low voltage is applied, a second electrode to which one of the next carry signals is applied, and a third electrode connected to the first stabilization transistor.

In an embodiment, each of the Q node charger, the Q node stabilizer, and the inverter may include an oxide semiconductor transistor.

In an embodiment, the second pre-stage may be configured to adjust the level of the voltage of the feedback node to reduce a leakage current of the transistor configured to connect the feedback node to the Q node, to generate a carry signal based on the voltage of the Q node, and to output the carry signal to the active stage.

According to an embodiment of the present disclosure, a display device may include a display panel including a display part for displaying an image and a peripheral part adjacent to the display part, a data driver configured to apply a data voltage to the display panel, and a gate driver including a plurality of active stages configured to output gate signals to the display part and a plurality of pre-stages connected to the active stages to output carry signals to the active stages. The pre-stages may include a first pre-stage and a second pre-stage. The second pre-stage may include a Q node compensator configured to receive a clock signal from the first pre-stage and to compensate for a voltage of a Q node based on the clock signal of the first pre-stage. The Q node compensator may include a feedback transistor configured to diode-connect a feedback input terminal, which is configured to receive the clock signal of the first pre-stage, to a feedback node of the second pre-stage.

In an embodiment, the feedback transistor may include a first electrode, a second electrode, and a third electrode, the first electrode being connected to the feedback input terminal, the second electrode being connected to the first electrode, and the third electrode being connected to the feedback node.

In an embodiment, the second electrode of the feedback transistor may be a gate electrode.

In an embodiment, the clock signal of the first pre-stage may be one of a carry signal of the first pre-stage, a sensing signal of the first pre-stage, or a gate signal of the first pre-stage.

In an embodiment, the Q node compensator may be configured to adjust a level of a voltage applied to the feedback node to reduce a drain-source voltage of at least one of transistors configured to connect the feedback node to the Q node.

In an embodiment, the second pre-stage may include a Q node charger configured to receive a vertical start signal to charge the Q node, a Q node stabilizer configured to receive a carry signal of the active stage to stabilize the Q node, and an inverter configured to generate an inverting signal based on the voltage of the Q node.

In an embodiment, the feedback node of the second pre-stage may be connected to the Q node charger, the Q node stabilizer, and the inverter.

In an embodiment, the second pre-stage may include a transistor stabilizer configured to stabilize a plurality of transistors connected to the feedback node based on a transistor stabilization signal. The transistor stabilizer may include a first transistor stabilization transistor and a second transistor stabilization transistor. The first transistor stabilization transistor may include a first electrode connected to the second transistor stabilization transistor, a second electrode connected to the Q node, and a third electrode connected to the feedback node. The second transistor stabilization transistor may include a first electrode to which a gate high voltage is applied, a second electrode connected to the Q node, and a third electrode connected to the first transistor stabilization transistor.

In an embodiment, the Q node charger may include a first charging transistor and a second charging transistor. The second charging transistor may include a first electrode configured to receive the vertical start signal, a second electrode connected to the first electrode, and a third electrode connected to the first charging transistor. The first charging transistor may include a first electrode connected to the second charging transistor, a second electrode connected to the first electrode of the second charging transistor, and a third electrode connected to the Q node.

In an embodiment, the Q node stabilizer may include a first stabilization transistor and a second stabilization transistor. The first stabilization transistor may include a first electrode connected to the second stabilization transistor, a second electrode to which one of next carry signals is applied, and a third electrode connected to the Q node. The second stabilization transistor may include a first electrode to which a first low voltage is applied, a second electrode to which one of the next carry signals is applied, and a third electrode connected to the first stabilization transistor.

In an embodiment, each of the Q node charger, the Q node stabilizer, and the inverter may include an oxide semiconductor transistor.

In an embodiment, the second pre-stage may be configured to adjust the level of the voltage of the feedback node to reduce a leakage current of the transistor configured to connect the feedback node to the Q node, to generate a carry signal based on the voltage of the Q node, and to output the carry signal to the active stage.

According to an embodiment of the present disclosure, a method of driving a display device may include: outputting gate signals from a plurality of active stages to a display part of the display device; and outputting carry signals from a plurality of pre-stages to the plurality of active stages, wherein the pre-stages include a first pre-stage and a second pre-stage, wherein the second pre-stage includes a Q node compensator configured to receive a clock signal from the first pre-stage and to compensate for a voltage of a Q node based on the clock signal of the first pre-stage, wherein the Q node compensator includes a feedback transistor configured to diode-connect a feedback input terminal, which is configured to receive the clock signal of the first pre-stage, to a feedback node of the second pre-stage.

According to a gate driver, display device, and method thereof, the pre-stage included in the gate driver may receive a clock signal from a previous pre-stage to hold the voltage of the Q node and may compensate for the voltage of the Q node based on the clock signal of the previous pre-stage. As a result, the gate driver, display device, and method thereof may optimize a display quality of the display device.

DETAILED DESCRIPTION

Hereinafter, embodiments of the present disclosure will be explained in detail with reference to the accompanying drawings.

Figure 1:
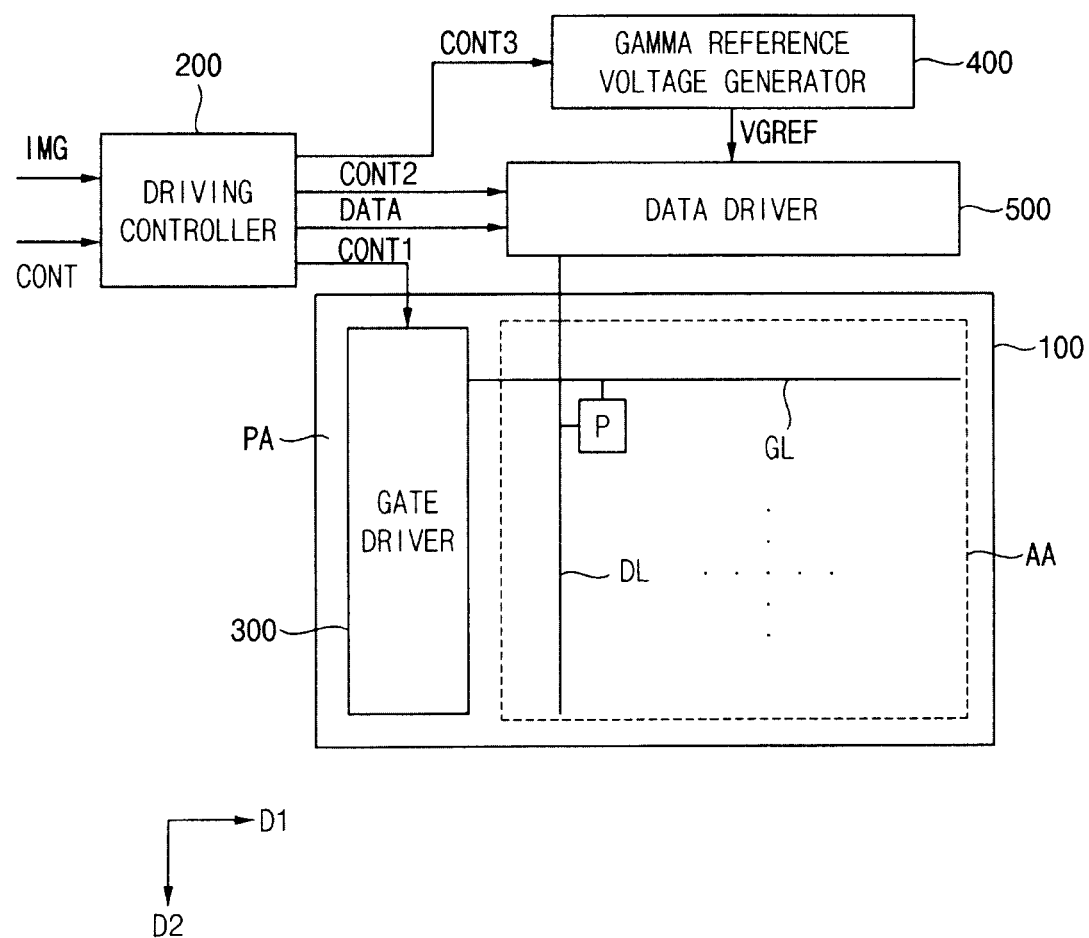
FIG. 1 is a block diagram illustrating a display device according to an embodiment of the present disclosure.

FIG. 1 illustrates a display device according to an embodiment of the present disclosure.

Referring to FIG. 1, a display device may include a display panel 100 and a display panel driver. The display panel driver may include a driving controller 200, a gate driver 300, a gamma reference voltage generator 400, and a data driver 500.

For example, the driving controller 200 and the data driver 500 may be formed integrally with each other. For example, the driving controller 200, the gamma reference voltage generator 400, and the data driver 500 may be formed integrally with each other. A driving module in which at least the driving controller 200 and the data driver 500 are integrally formed may be referred to as a timing controller-embedded data driver (TED).

The display panel 100 may include a display part AA for displaying an image, and a peripheral part PA adjacent to the display part.

The display panel 100 may include a plurality of gate lines GL, a plurality of data lines DL, and a plurality of pixels P electrically connected to the gate lines GL and the data lines DL, respectively. The gate lines GL may extend in a first direction D1, and the data lines DL may extend in a second direction D2 intersecting the first direction D1.

The driving controller 200 may receive input image data IMG and an input control signal CONT from an external device. For example, the input image data IMG may include red image data, green image data, and blue image data. The input image data IMG may include white image data. The input image data IMG may include magenta image data, yellow image data, and cyan image data. The input control signal CONT may include a master clock signal and a data enable signal. The input control signal CONT may further include a vertical synchronization signal and a horizontal synchronization signal.

The driving controller 200 may generate a first control signal CONT1, a second control signal CONT2, a third control signal CONT3, and a data signal DATA based on the input image data IMG and the input control signal CONT.

The driving controller 200 may generate the first control signal CONT1 for controlling an operation of the gate driver 300 based on the input control signal CONT to output the generated first control signal CONT1 to the gate driver 300. The first control signal CONT1 may include a vertical start signal and a gate clock signal.

The driving controller 200 may generate the second control signal CONT2 for controlling an operation of the data driver 500 based on the input control signal CONT to output the generated second control signal CONT2 to the data driver 500. The second control signal CONT2 may include a horizontal start signal and a load signal.

The driving controller 200 may generate the data signal DATA based on the input image data IMG. The driving controller 200 may output the data signal DATA to the data driver 500.

The driving controller 200 may generate the third control signal CONT3 for controlling an operation of the gamma reference voltage generator 400 based on the input control signal CONT to output the generated third control signal CONT3 to the gamma reference voltage generator 400.

The gate driver 300 may generate gate signals for driving the gate lines GL in response to the first control signal CONT1 received from the driving controller 200. The gate driver 300 may output the gate signals to the gate lines GL. For example, the gate driver 300 may sequentially output the gate signals to the gate lines GL.

According to the present embodiment, the gate driver 300 may be integrated on the peripheral part PA of the display panel.

The gamma reference voltage generator 400 may generate a gamma reference voltage VGREF in response to the third control signal CONT3 received from the driving controller 200. The gamma reference voltage generator 400 may provide the gamma reference voltage VGREF to the data driver 500. The gamma reference voltage VGREF may have a value corresponding to each data signal DATA.

According to one embodiment of the present disclosure, the gamma reference voltage generator 400 may be disposed in the driving controller 200 or the data driver 500.

The data driver 500 may receive the second control signal CONT2 and the data signal DATA from the driving controller 200, and receive the gamma reference voltage VGREF from the gamma reference voltage generator 400. The data driver 500 may convert the data signal DATA into an analog data voltage by using the gamma reference voltage VGREF. The data driver 500 may output the data voltage to the data line DL.

Figure 2:
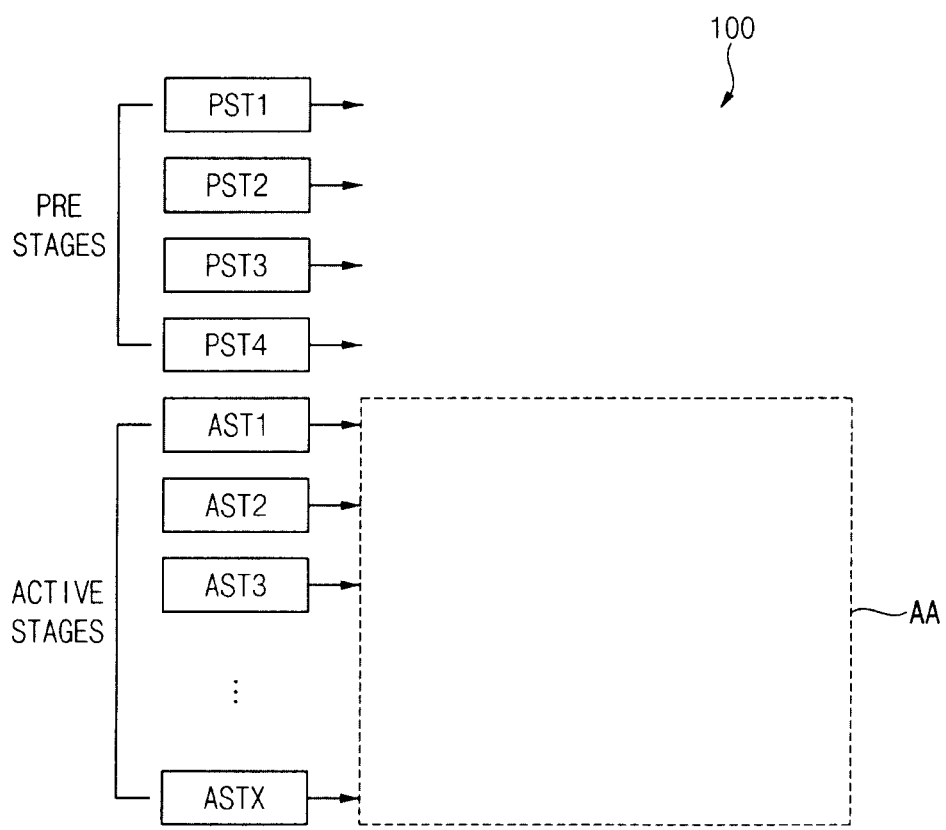
FIG. 2 is a block diagram illustrating a gate driver included in the display device of FIG. 1.
Figure 3A:
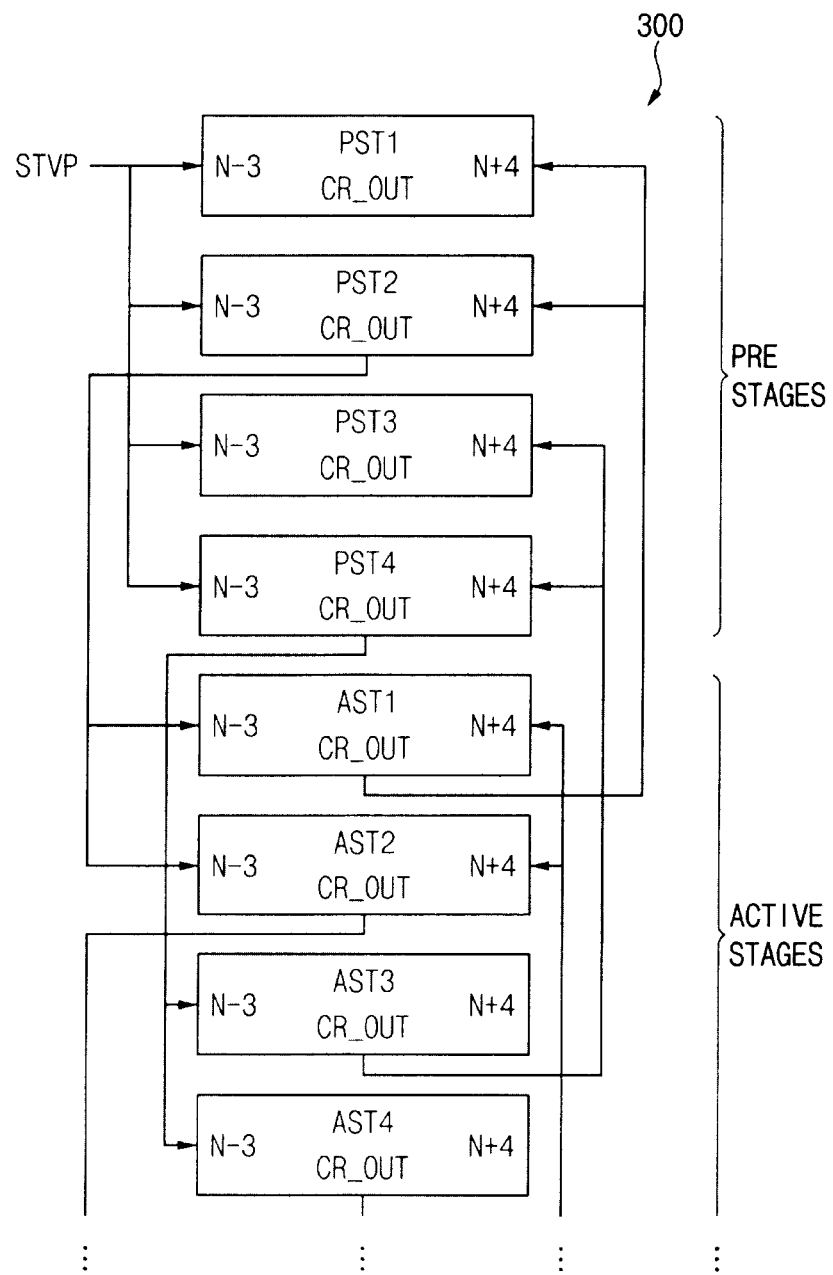
FIG. 3A is a block diagram illustrating a carry output line between stages of the gate driver of FIG. 2.
Figure 3B:
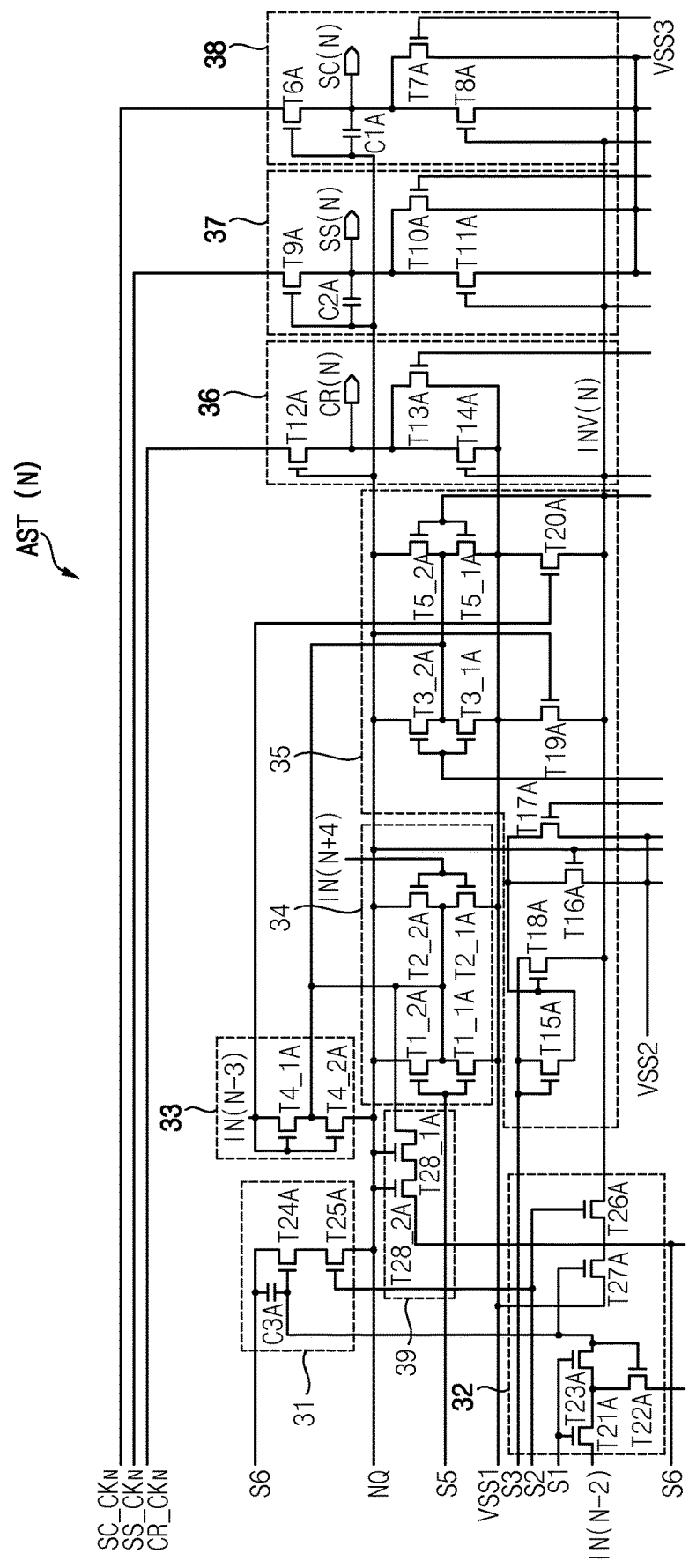
FIG. 3B is a circuit diagram illustrating an active stage included in the gate driver of FIG. 2.

FIG. 2 illustrates a gate driver included in the display device of FIG. 1, FIG. 3A illustrates a carry output line between stages of the gate driver of FIG. 2, and FIG. 3B illustrates an active stage included in the gate driver of FIG. 2.

Referring to FIGS. 1 to 3B, the gate driver 300 of the display panel 100 may include a plurality of active stages AST1 to ASTX and a plurality of pre-stages PST1 to PST4.

The active stages AST1 to ASTX may output the gate signals to the display part AA. For example, the number of the active stages AST1 to ASTX may be equal to the number of the gate lines of the display part AA of the display panel 100. For example, the number of the active stages AST1 to ASTX may be equal to the number of pixel rows of the display part AA of the display panel 100. Each of the active stages AST1 to ASTX may output the gate signal and a carry signal.

The pre-stages PST1 to PST4 may be connected to the active stages AST1 to ASTX to output carry signals to the active stages AST1 to ASTX. Although four pre-stages PST1 to PST4 have been illustrated in FIG. 2, the number of the pre-stages is not limited thereto.

First to sixth input signals (e.g., S1 to S6), an $N^{th}$ clock signal, where N is a natural number, and first to third low voltages (e.g., VSS1, VSS2, and VSS3) may be applied to an $N^{th}$ active stage ASTN. The $N^{th}$ clock signal may include a gate clock signal SC_CK, a sensing clock signal SS_CK, and a carry clock signal CR_CK. During an active period, the gate clock signal SC_CK, the sensing clock signal SS_CK, and the carry clock signal CR_CK may have the same timing. Six clock signals (e.g., CK1 to CK6) having mutually different phases may be sequentially applied to the active stages AST1 to ASTX of the gate driver 300. Here, a period of a waveform of each of the clock signals may be six horizontal periods.

For example, a first clock signal may be applied to a first active stage AST1, a second clock signal may be applied to a second active stage AST2, a third clock signal CK3 may be applied to a third active stage AST3, a fourth clock signal may be applied to a fourth active stage AST4, a fifth clock signal may be applied to a fifth active stage AST5, a sixth clock signal may be applied to a sixth active stage AST6, the first clock signal may be applied to a seventh active stage AST7, the second clock signal may be applied to an eighth active stage AST8, the third clock signal may be applied to a ninth active stage AST9, the fourth clock signal may be applied to a tenth active stage AST10, the fifth clock signal may be applied to an eleventh active stage, and the sixth clock signal may be applied to a twelfth active stage.

The $N^{th}$ stage may include a first sensor 31, a second sensor 32, a Q node charger 33, a Q node stabilizer 34, an inverter 35, a carry signal output unit 36, a sensing signal output unit 37, a gate signal output unit 38, and a transistor stabilizer 39.

The first sensor 31 and the second sensor 32 may operate based on the first input signal S1, the second input signal S2, the sixth input signal S6, and a Q node (NQ) signal, and sense a characteristic of a transistor disposed in a pixel part of the display panel 100. The first sensor 31 may include a first sensing transistor T24A, a second sensing transistor T25A, and a sensing capacitor C3A. The second sensor 32 may include a third sensing transistor T21A, a fourth sensing transistor T22A, a fifth sensing transistor T23A, a sixth sensing transistor T26A, and a seventh sensing transistor T27A.

The Q node charger 33 may charge a Q node NQ based on one of previous carry signals. Here, one of the previous carry signals may be a carry signal IN(N−3) or $IN_{N-3}$ of a previous stage that is located three-stage before a current stage. The Q node charger 33 may include a first charging transistor T4_1A and a second charging transistor T4_2A.

The Q node stabilizer 34 may stabilize the Q node NQ based on one of next carry signals and the fifth input signal S5. Here, one of the next carry signals may be a carry signal IN(N+4) or $IN_{N+4}$ of a next stage that is located four-stage after the current stage. For example, the Q node stabilizer 34 may receive the carry signal IN(N+4) of the next stage that is located four-stage after the current stage. Here, the fifth input signal S5 may be a vertical start signal. The Q node stabilizer 34 may include a first stabilization transistor T1_1A, a second stabilization transistor T1_2A, a third stabilization transistor T2_1A, and a fourth stabilization transistor T2_2A.

The inverter 35 may generate an inverting signal INV(N) or $INV_N$ based on the third input signal S3 and the Q node (NQ) signal. The inverter 35 may include a first inverting transistor T3_1A, a second inverting transistor T3_2A, a third inverting transistor T19A, a fourth inverting transistor T5_1A, a fifth inverting transistor T5_2A, a sixth inverting transistor T20A, a seventh inverting transistor T15A, an eighth inverting transistor T16A, a ninth inverting transistor T17A, and a tenth inverting transistor T18A.

The carry signal output unit 36 may output a carry signal CR(N) OR $CR_N$ based on the Q node (NQ) signal and the inverting signal INV(N). The carry signal output unit 36 may include a first carry transistor T12A, a second carry transistor T13A, and a third carry transistor T14A.

The sensing signal output unit 37 may output a sensing signal SS(N) OR $SS_N$ based on the Q node (NQ) signal and the inverting signal INV(N). The sensing signal output unit 37 may include a first sensing output transistor T9A, a second sensing output transistor T10A, and a third sensing output transistor T11A. The sensing signal output unit 37 may further include a sensing output capacitor C2A connected between a control electrode and an output electrode of the first sensing output transistor T9A.

The gate signal output unit 38 may output a gate signal SC(N) OR $SC_N$ based on the Q node (NQ) signal and the inverting signal INV(N). The gate signal output unit 38 may include a first gate transistor T6A, a second gate transistor T7A, and a third gate transistor T8A. The gate signal output unit 38 may further include a gate capacitor C1A connected between a control electrode and an output electrode of the first gate transistor T6A.

The transistor stabilizer 39 may transmit the sixth input signal S6 to an intermediate node of transistors that are connected in series in response to the Q node NQ so as to stabilize operations of the transistors that are connected in series. The transistor stabilizer 39 may include a first transistor stabilization transistor T28_1A and a second transistor stabilization transistor T28_2A.

According to one embodiment, the gate driver may include a first pre-stage PST1, a second pre-stage PST2, a third pre-stage PST3, and a fourth pre-stage PST4. The first pre-stage PST1 and the second pre-stage PST2 may operate as a pair. The second pre-stage may output a pre-carry signal to the first active stage AST1 and the second active stage AST2. The third pre-stage PST3 and the fourth pre-stage PST4 may operate as a pair. The fourth pre-stage may output a pre-carry signal to the third active stage AST3 and the fourth active stage AST4.

Figure 4:
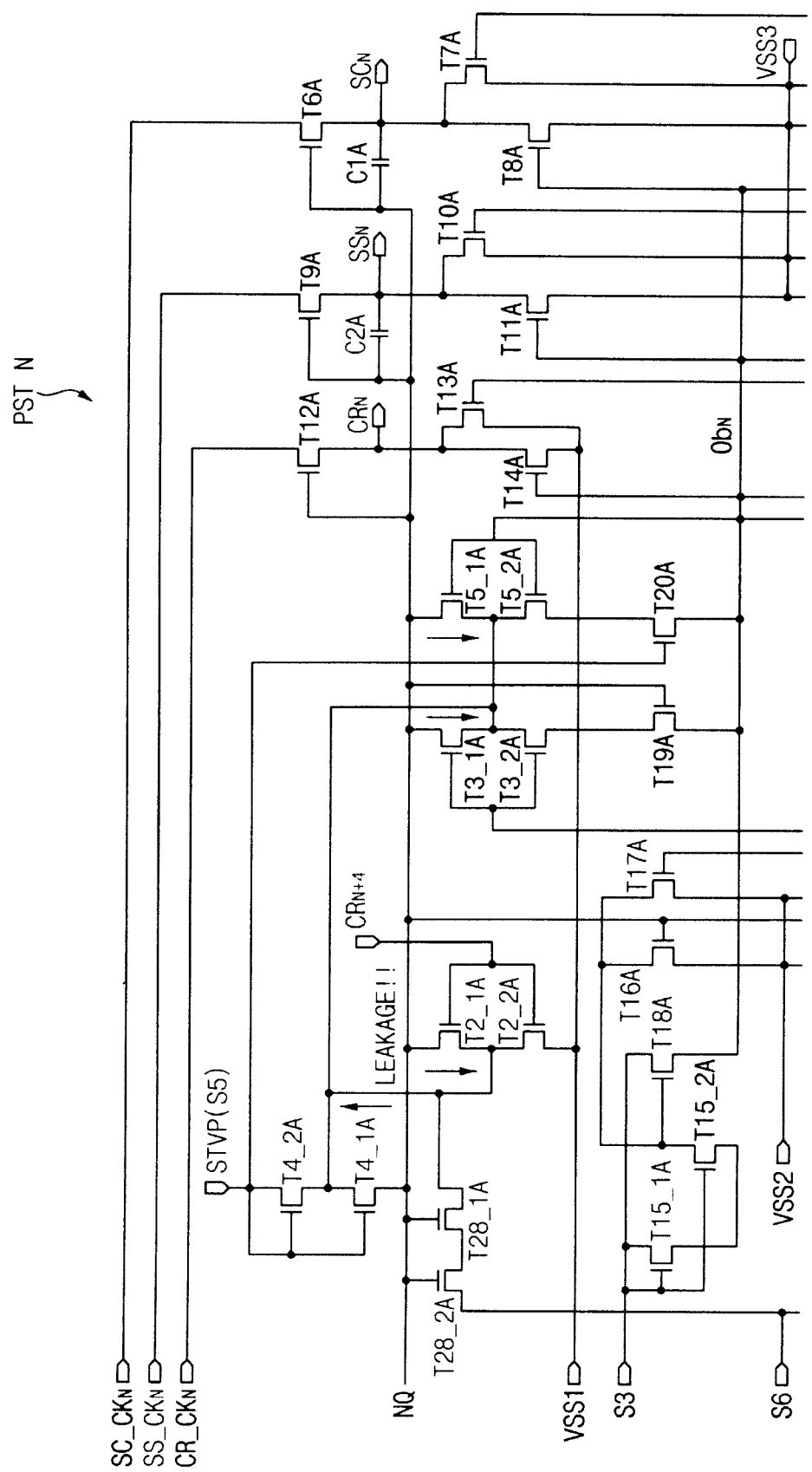
FIG. 4 is a circuit diagram illustrating a pre-stage included in the gate driver of FIG. 2.
Figure 5:
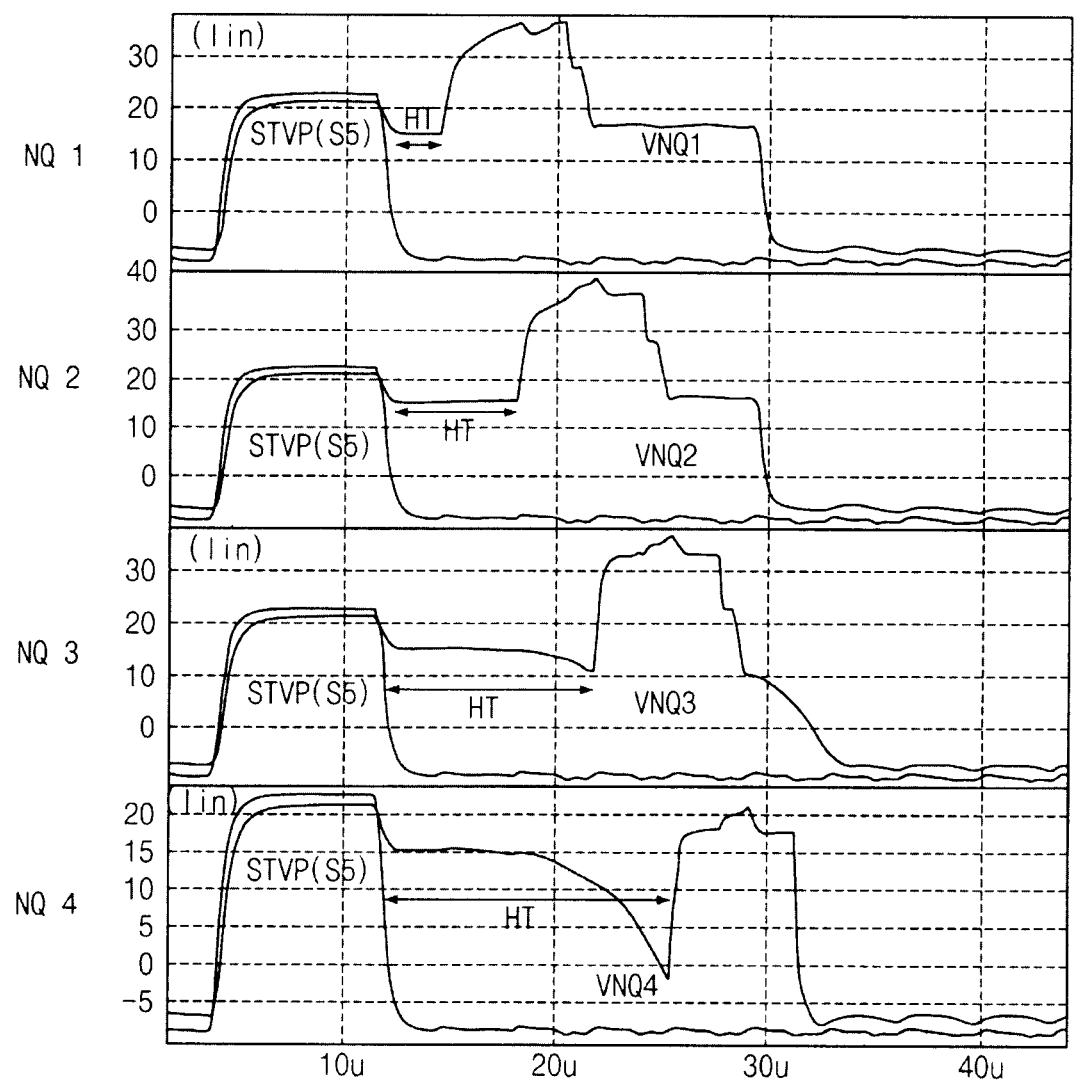
FIG. 5 is a timing diagram illustrating a voltage of a Q node of the pre-stage of FIG. 4.

FIG. 4 illustrates a pre-stage included in the gate driver of FIG. 2, and FIG. 5 illustrates a voltage of a Q node of the pre-stage of FIG. 4.

Referring to FIGS. 4 and 5, circuit structures of the pre-stages PST1 to PST4 may be the same as circuit structures of the active stages AST1 to ASTX. When compared with the circuit structures of the active stages AST1 to ASTX, circuits of the pre-stages PST1 to PST4 may have structures obtained by excluding the first sensor and the second sensor from circuits of the active stages AST1 to ASTX. The pre-stages PST1 to PST4 may include a Q node NO.

The pre-stages PST1 to PST4 may pre-charge the Q node NQ based on a vertical start signal STVP. When leakage currents of transistors are passed in the pre-stages PST1 to PST4, a voltage of the Q node NQ might not be held. When the voltage of the Q node NQ in the pre-stages PST1 to PST4 is not held, the active stages AST1 to ASTX may output abnormal sensing signals and abnormal gate signals.

In detail, after the Q node is charged, the voltage of the Q node NQ may have a holding time HT. Upon a threshold voltage sensing (Vth sensing) operation, in order to ensure a sufficient sensing time, the voltage of the Q node NQ may be held in a floating state in the pre-stages PST1 to PST4 and the active stages AST1 to ASTX. In other words, the holding time HT may be a time for holding the voltage of the Q node NQ in the floating state after the Q node NQ is charged. In particular, since the pre-stages PST1 to PST4 pre-charge the Q node NQ based on the vertical start signal STVP, the holding time HT of the Q node NQ may increase from the first pre-stage PST1 to the fourth pre-stage PST4.

For example, Q nodes of the pre-stages PST1 to PST4 are shown in FIG. 5 as first to fourth Q nodes NQ1 to NQ4. A first Q node voltage VNQ1 may be held at a normal voltage level in the first Q node NQ1. On the contrary, because of the leakage current of the transistor, a fourth Q node voltage VNQ4 may have an abnormal voltage level in the fourth Q node NQ4 as the holding time increases. Here, the active stages AST1 to ASTX that have received a carry signal generated based on the fourth Q node voltage VNQ4 may output abnormal sensing signals and abnormal gate signals.

In an embodiment of the present disclosure, the pre-stage may include a Q node compensator 310 configured to receive a clock signal from a previous pre-stage to hold the voltage of the Q node NQ, and compensate for the voltage of the Q node based on the clock signal of the previous pre-stage.

Figure 6:
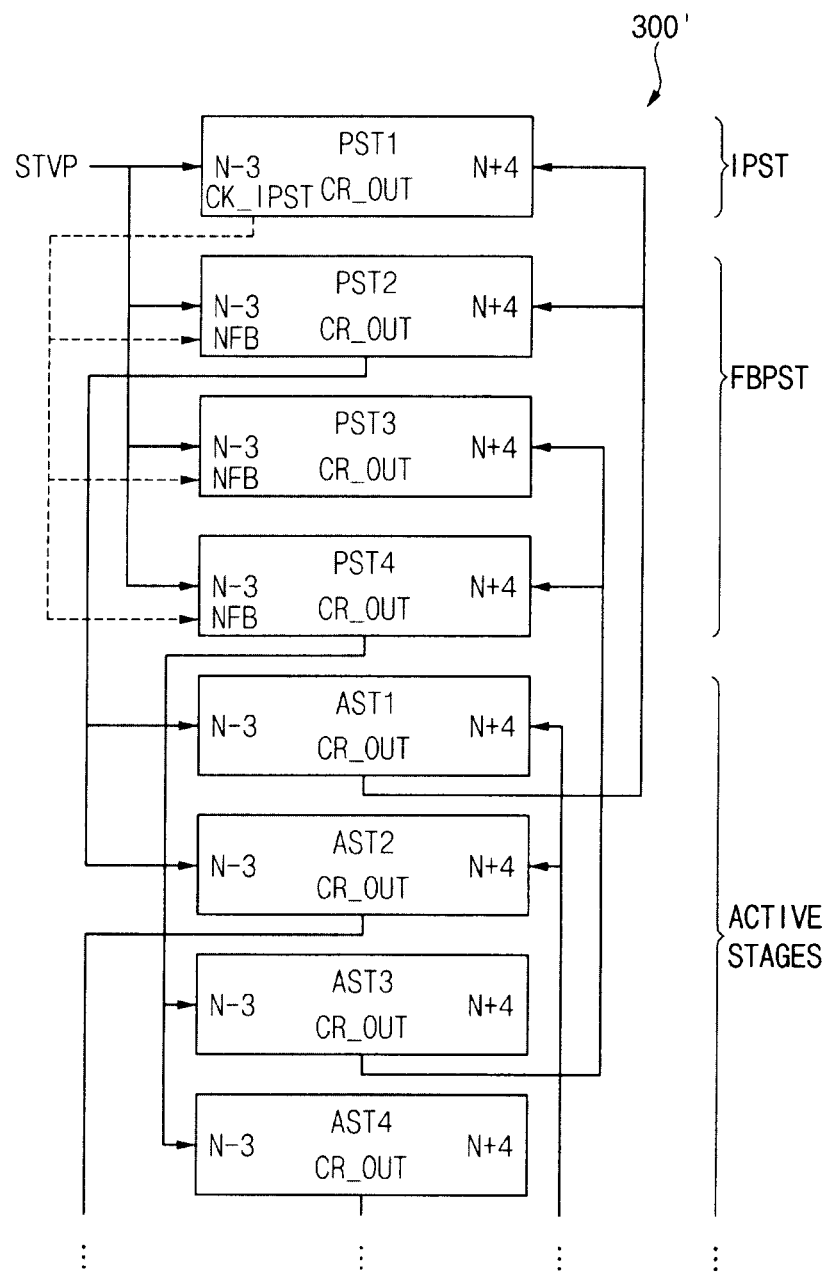
FIG. 6 is a block diagram illustrating a carry output line between stages when an initial pre-stage and a feedback pre-stage are connected to each other through a feedback line according to an embodiment of the present disclosure.
Figure 7:
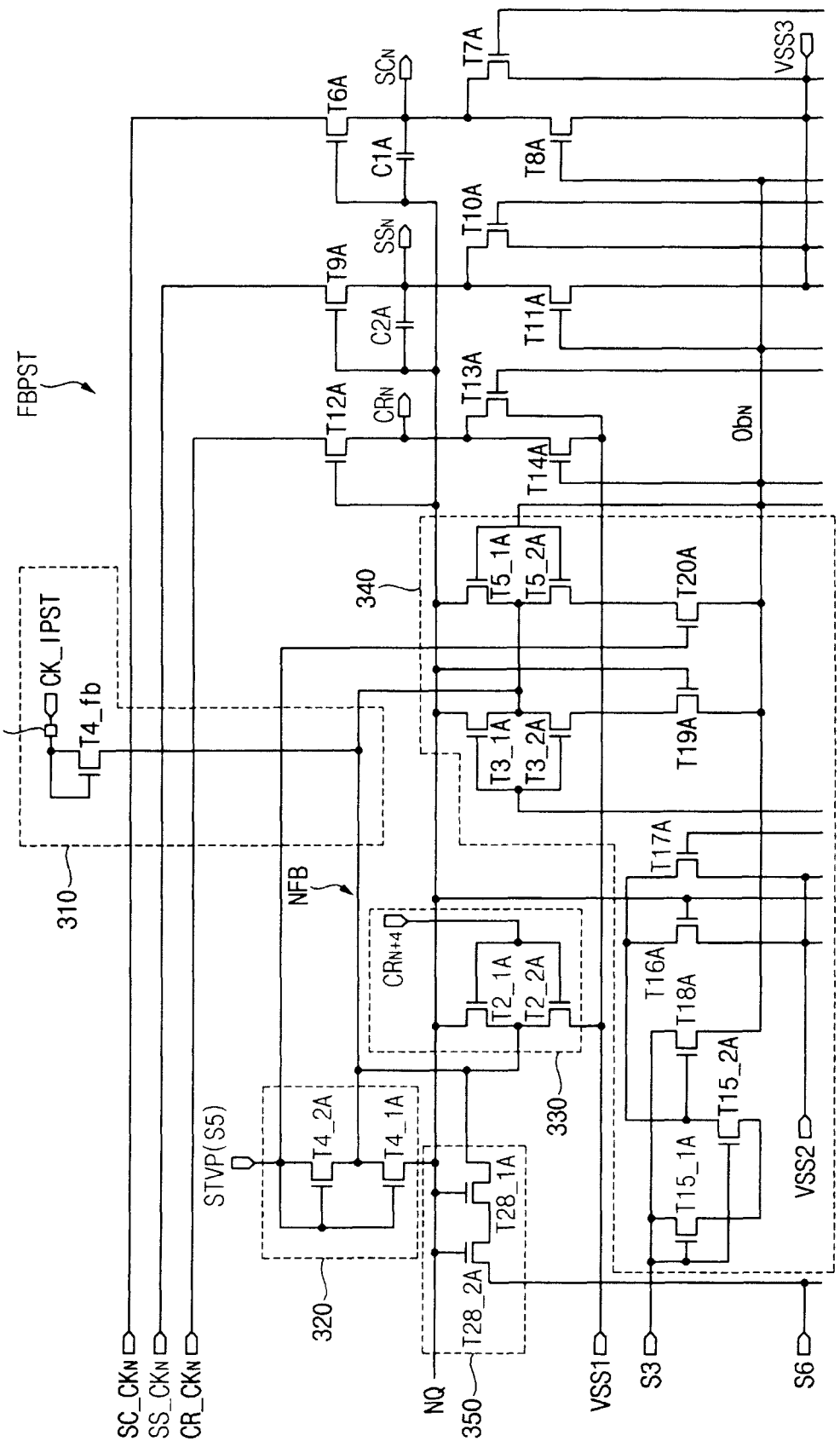
FIG. 7 is a circuit diagram illustrating the feedback pre-stage in FIG. 6.
Figure 8:
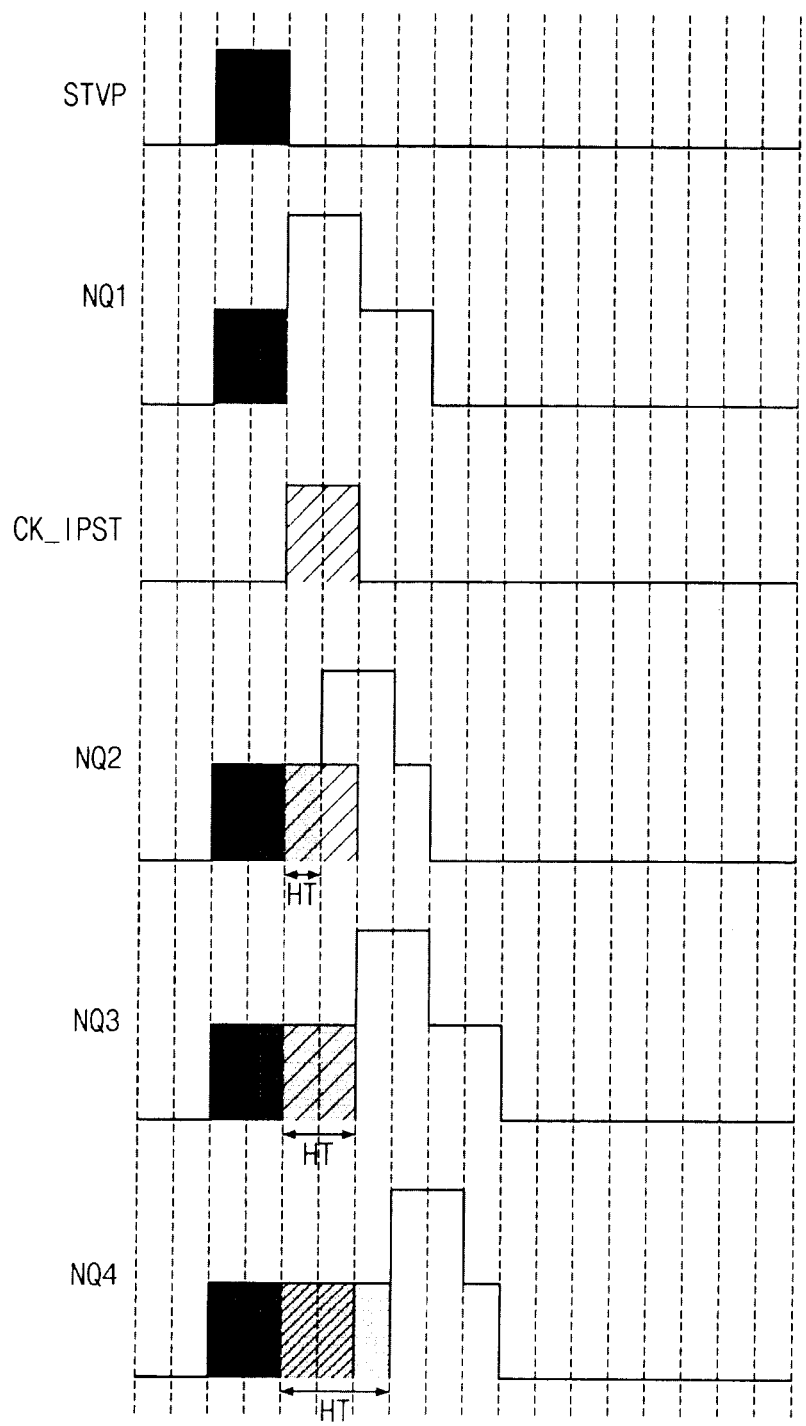
FIG. 8 is a timing diagram illustrating input/output signals of the initial pre-stage and the feedback pre-stage in FIG. 6.
Figure 9:
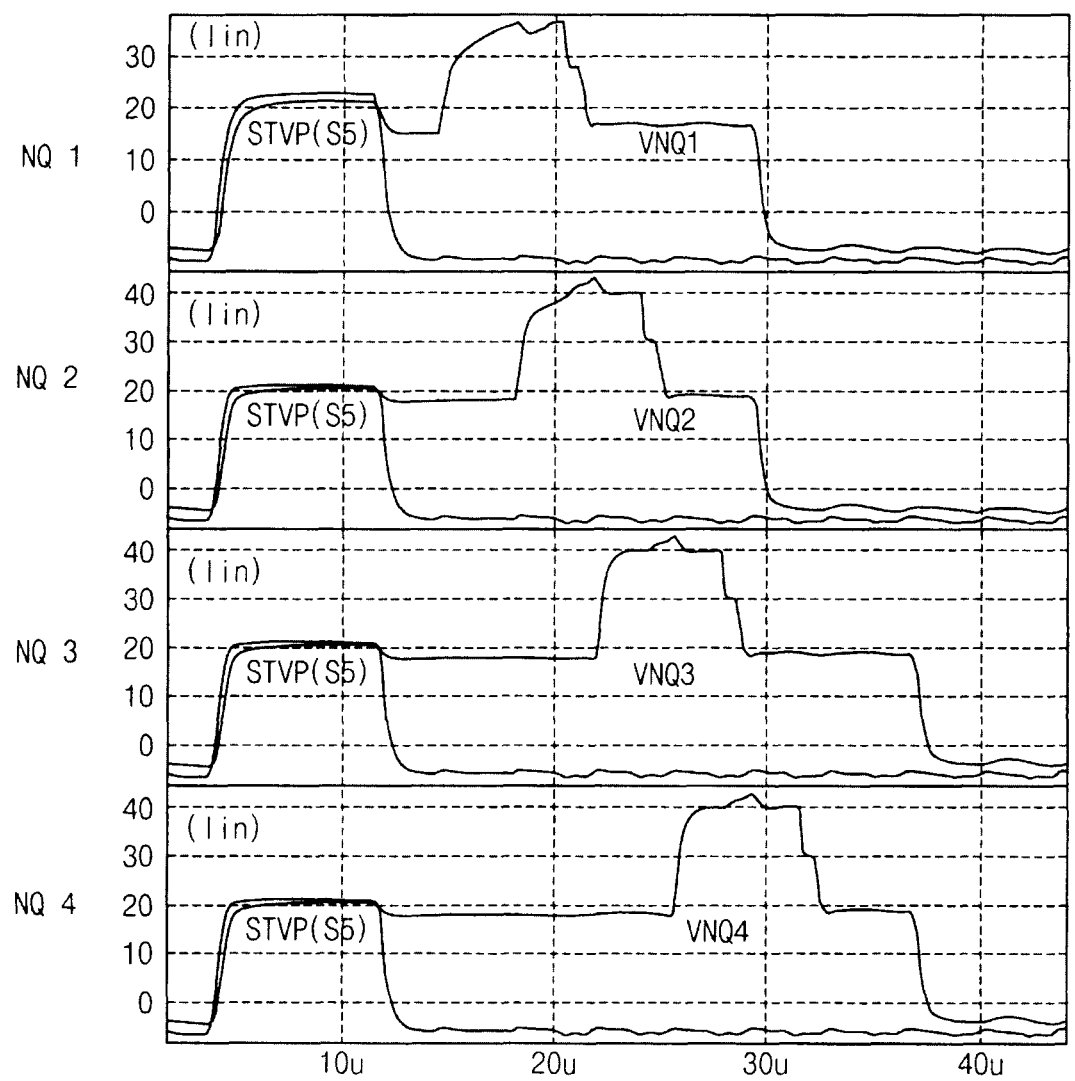
FIG. 9 is a timing diagram illustrating voltages of Q nodes of the initial pre-stage and the feedback pre-stage in FIG. 6.

FIG. 6 illustrates a carry output line between stages when an initial pre-stage and a feedback pre-stage are connected to each other through a feedback line according to an embodiment of the present disclosure. FIG. 7 illustrates the feedback pre-stage in FIG. 6, FIG. 8 illustrates input/output signals of the initial pre-stage and the feedback pre-stage in FIG. 6, and FIG. 9 illustrates voltages of Q nodes of the initial pre-stage and the feedback pre-stage in FIG. 6.

Referring to FIGS. 6 to 9, the pre-stages PST1 to PST4 of a gate driver 300' may include an initial pre-stage IPST and a feedback pre-stage FBPST. Duplicate description may be omitted. The feedback pre-stage FBPST may include a Q node compensator 310 configured to receive a clock signal CK_IPST from the initial pre-stage IPST, and compensate for the voltage of the Q node NQ based on the clock signal CK_IPST of the initial pre-stage IPST. Although it has been shown in FIG. 6 that the first pre-stage PST1 is an initial pre-stage IPST, and the second to fourth pre-stages PST2 to PST4 are feedback pre-stages FBPST, the initial pre-stage IPST and the feedback pre-stage FBPST according to the present disclosure are not limited thereto. For example, a plurality of initial pre-stages IPST may be provided.

As shown in FIG. 7, the feedback pre-stage FBPST may include a Q node charger 320, a Q node stabilizer 330, an inverter 340, and a transistor stabilizer 350. Here, the feedback pre-stage FBPST may further include a Q node compensator 310. Each of the Q node charger 320, the Q node stabilizer 330, and the inverter 340 may include an oxide semiconductor transistor.

The Q node charger 320 may charge the Q node NQ based on the vertical start signal. The Q node charger 320 may include a first charging transistor T4_1A and a second charging transistor T4_2A. The second charging transistor T4_2A may include a source electrode configured to receive the vertical start signal STVP, a gate electrode connected to the source electrode, and a drain electrode connected to the first charging transistor T4_1A. The first charging transistor T4_1A may include a source electrode connected to the second charging transistor T4_2A, a gate electrode connected to the source electrode of the second charging transistor T4_2A, and a drain electrode connected to the Q node NQ.

The Q node stabilizer 330 may stabilize the Q node NQ based on the carry signal of the active stage. The Q node stabilizer 330 may include a first stabilization transistor T2_1A and a second stabilization transistor T2_2A. The first stabilization transistor T2_1A may include a source electrode connected to the second stabilization transistor T2_2A, a gate electrode to which one of next carry signals is applied, and a drain electrode connected to the Q node NQ. The second stabilization transistor T2_2A may include a source electrode to which a first low voltage VSS1 is applied, a gate electrode to which one of the next carry signals is applied, and a drain electrode connected to the first stabilization transistor T2_1A.

The inverter 340 may generate the inverting signal based on the voltage of the Q node NQ. The inverter 340 may include a first inverting transistor T3_1A, a second inverting transistor T3_2A, a third inverting transistor T5_1A, and a fourth inverting transistor T5_2A.

The transistor stabilizer 350 may stabilize a plurality of transistors connected to a feedback node NFB based on a transistor stabilization signal. The transistor stabilizer 350 may include a first transistor stabilization transistor T28_1A and a second transistor stabilization transistor T28_2A. The first transistor stabilization transistor T28_1A may include a source electrode connected to the second transistor stabilization transistor T28_2A, a gate electrode connected to the Q node NQ, and a drain electrode connected to the feedback node NFB. The second transistor stabilization transistor T28_2A may include a source electrode to which a gate high voltage S6 is applied, a gate electrode connected to the Q node NQ, and a drain electrode connected to the first transistor stabilization transistor T28_1A.

The Q node compensator 310 may receive the clock signal CK_IPST from the initial pre-stage IPST, and compensate for the voltage of the Q node NQ based on the clock signal CK_IPST of the initial pre-stage IPST. The Q node compensator 310 may include a feedback transistor T4_fb configured to diode-connect a feedback input terminal 311, which is configured to receive the clock signal CK_IPST of the initial pre-stage IPST, to the feedback node NFB of the feedback pre-stage FBPST. Here, the clock signal CK_IPST of the initial pre-stage IPST may be one of a carry signal CR(N) of the initial pre-stage IPST, a sensing signal SS(N) of the initial pre-stage IPST, or a gate signal SC(N) of the initial pre-stage IPST.

When the clock signal CK_IPST of the initial pre-stage IPST is input to the feedback node NFB, a voltage level of the feedback node NFB may be compensated for. When the voltage level of the feedback node NFB is compensated for by the clock signal CK_IPST of the initial pre-stage IPST, the voltage of the Q node NQ may be held at a normal level.

In detail, the feedback node NFB of the feedback pre-stage FBPST may be connected to the Q node charger 320, the Q node stabilizer 330, and the inverter 340. When the clock signal CK_IPST of the initial pre-stage IPST is input to the feedback node NFB to compensate for the voltage level of the feedback node NFB, a drain-source voltage of a transistor configured to connect the feedback node NFB to the Q node NQ may be reduced. In other words, when the clock signal CK_IPST of the initial pre-stage IPST is input to the feedback node NFB to hold the voltage level of the feedback node NFB at an activation level (i.e., a high level) of the clock signal CK_IPST of the initial pre-stage IPST, the drain-source voltage of the transistor configured to connect the feedback node NFB to the Q node NQ may be reduced. When the drain-source voltage of the transistor configured to connect the feedback node NFB to the Q node NQ is reduced, the voltage of the Q node NQ may be held at a normal level. In addition, when the clock signal CK_IPST of the initial pre-stage IPST is input to the feedback node NFB to compensate for the voltage level of the feedback node NFB, a leakage current of the transistor configured to connect the feedback node NFB to the Q node NQ may be reduced. In other words, leakage currents passed in the Q node charger, the Q node stabilizer, and the inverter 340 may be reduced. When the leakage current of the transistor configured to connect the feedback node NFB to the Q node NQ is reduced, the voltage of the Q node NQ may be held at a normal level.

As shown in FIG. 8, when the clock signal CK_IPST of the initial pre-stage IPST is input to the feedback node NFB to compensate for the voltage level of the feedback node NFB, during the holding time HT of the feedback pre-stage FBPST, drain-source voltages of the first charging transistor T4_1A, the first stabilization transistor T2_1A, the first inverting transistor T3_1A, and the third inverting transistor T5_1A, which are included in the feedback pre-stage FBPST, may be reduced. When the clock signal CK_IPST of the initial pre-stage IPST is input to the feedback node NFB to compensate for the voltage level of the feedback node NFB, during the holding time HT of the feedback pre-stage FBPST, leakage currents of the first charging transistor T4_1A, the first stabilization transistor T2_1A, the first inverting transistor T3_1A, and the third inverting transistor T5_1A, which are included in the feedback pre-stage FBPST, may be reduced.

For example, since the clock signal CK_IPST of the initial pre-stage IPST is continuously input to the feedback node NFB during the holding time HT in the second pre-stage PST2, leakage currents need not be passed by transistors configured to connect the feedback node NFB to the Q node NQ during the holding time HT in the second Q node NQ2.

For example, since the clock signal CK_IPST of the initial pre-stage IPST is continuously input to the feedback node NFB during the holding time HT in the third pre-stage PST3, leakage currents need not be passed by transistors configured to connect the feedback node NFB to the Q node NQ during the holding time HT in the third Q node NQ3.

For example, since the clock signal CK_IPST of the initial pre-stage IPST is input to the feedback node NFB during a partial period of the holding time HT in the fourth pre-stage PST4, a period in which leakage currents are passed by transistors configured to connect the feedback node NFB to the Q node NQ may be reduced to $1/3$ as compared with the previous case during the holding time HT in the fourth Q node NQ4. For example, the period in which the leakage currents are passed by the transistors configured to connect the feedback node NFB to the Q node NQ may be reduced from 3H to 1H during the holding time HT in the fourth Q node NQ4. In other words, the leakage currents passed by the transistors configured to connect the feedback node NFB to the Q node NQ may be minimized during the holding time HT.

As shown in FIG. 9, the feedback pre-stage FBPST may generate a carry signal based on the voltage of the Q node NQ held at a normal level. The feedback pre-stage FBPST may output the carry signal to the active stage. When the carry signal is received from the feedback pre-stage FBPST, the active stages AST1 to ASTX may output normal sensing signals and normal gate signals. As a result, according to the gate driver and the display device including the same, display quality of the display device may be improved.

Figure 10:
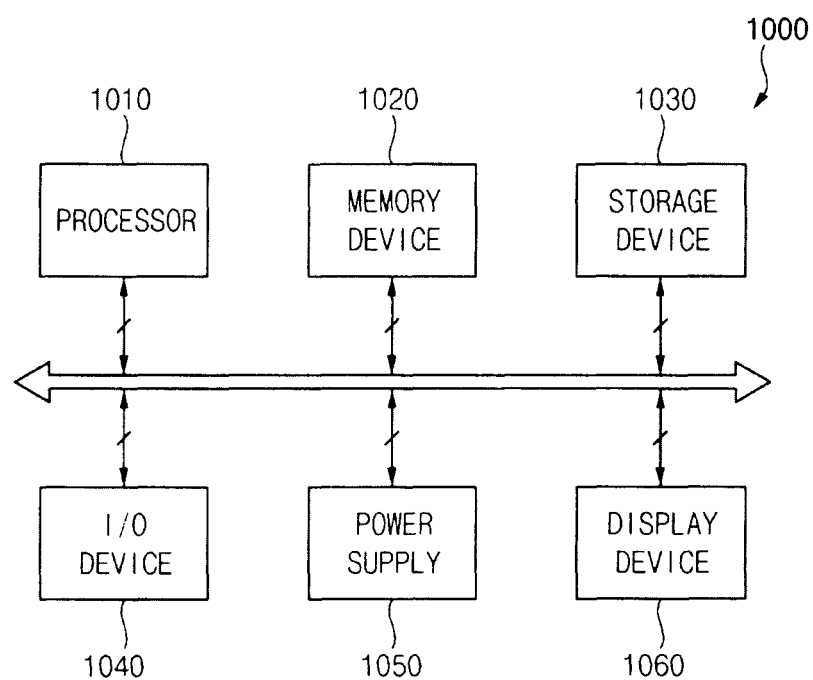
FIG. 10 is a block diagram illustrating an electronic device according to an embodiment of the present disclosure.
Figure 11:
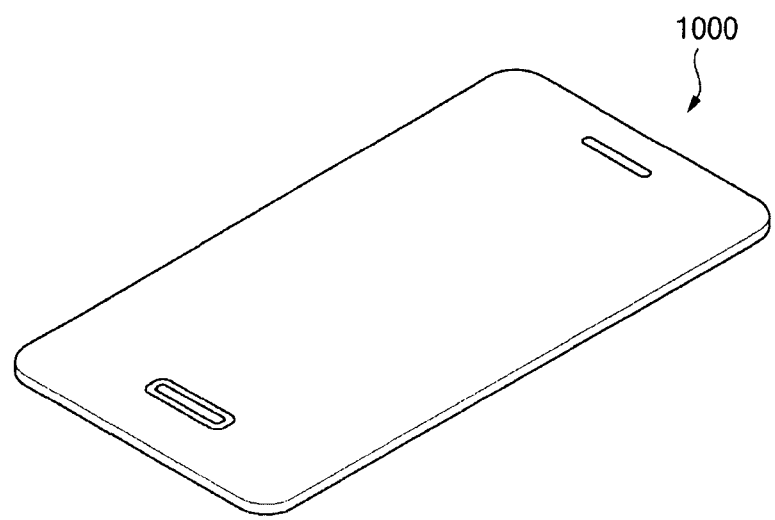
FIG. 11 is an isometric diagram illustrating an example in which the electronic device of FIG. 10 is implemented as a smart phone.

FIG. 10 illustrates an electronic device according to an embodiment of the present disclosure, and FIG. 11 illustrates an example in which the electronic device of FIG. 10 is implemented as a smart phone.

Referring to FIGS. 10 and 11, the electronic device 1000 may include a processor 1010, a memory device 1020, a storage device 1030, an input/output (I/O) device 1040, a power supply 1050, and a display device 1060. Here, the display device 1060 may be the display device of FIG. 1. In addition, the electronic device 1000 may further include a plurality of ports for communicating with a video card, a sound card, a memory card, a universal serial bus (USB) device, other electronic devices, or the like. In an embodiment, as shown in FIG. 11, the electronic device 1000 may be implemented as a smart phone. However, the electronic device 1000 is not limited thereto. For example, the electronic device 1000 may be implemented as a cellular phone, a video phone, a smart pad, a smart watch, a tablet PC, a car navigation system, a computer monitor, a laptop, a head mounted display (HMD) device, or the like.

The processor 1010 may perform various computing functions. The processor 1010 may be a microprocessor, a central processing unit (CPU), an application processor (AP), or the like. The processor 1010 may be coupled to other components via an address bus, a control bus, a data bus, or the like. Further, the processor 1010 may be coupled to an extended bus such as a peripheral component interconnection (PCI) bus. The memory device 1020 may store data for operations of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, or the like and/or at least one volatile memory device such as a dynamic random access memory (DRAM) device, a static random access memory (SRAM) device, a mobile DRAM device, or the like. The storage device 1030 may include a solid state drive (SSD) device, a hard disk drive (HDD) device, a CD-ROM device, or the like. The I/O device 1040 may include an input device such as a keyboard, a keypad, a mouse device, a touch pad, a touch screen, or the like, and an output device such as a printer, a speaker, or the like. In an alternate embodiment, the I/O device 1040 may include the display device 1060, for example. The power supply 1050 may provide power for operations of the electronic device 1000. The display device 1060 may be coupled to other components via the buses or other communication links.

The display device 1060 may display an image corresponding to visual information of the electronic device 1000. Here, according to the display device 1060, a level of a voltage of a Q node of a pre-stage may be stabilized to optimize image quality. To this end, the display device 1060 may include a display panel, a data driver, and a gate driver. The display panel may include a display part for displaying an image, and a peripheral part adjacent to the display part. The data driver may apply a data voltage to the display panel. The gate driver may include a plurality of active stages configured to output gate signals to the display part, and a plurality of pre-stages connected to the active stages to output carry signals to the active stages. The pre-stages may include a first pre-stage and a second pre-stage. Here, the second pre-stage may include a Q node compensator configured to receive a clock signal from the first pre-stage, and compensate for the voltage of the Q node based on the clock signal of the first pre-stage.

As described above, according to the present disclosure, the pre-stage may receive a clock signal from a previous pre-stage to hold the voltage of the Q node, and compensate for the voltage of the Q node based on the clock signal of the previous pre-stage. As a result, according to the gate driver and the display device including the same, display quality of the display device may be improved. Since these are described above, duplicated description will not be repeated.

The present disclosure may be applied to a display device and an electronic device including the display device. For example, the present disclosure may be applied to a cellular phone, a smart phone, a video phone, a smart pad, a smart watch, a tablet PC, a car navigation system, a television, a computer monitor, a laptop, a digital camera, a head mounted display device, or the like.

The foregoing is illustrative of the present disclosure and is not to be construed as limiting thereof. Although illustrative embodiments have been described, those of ordinary skill in the pertinent art will readily appreciate that many modifications are possible in these and other embodiments without materially departing from the novel teachings of the present disclosure. Therefore, it is to be understood that the foregoing is illustrative of various embodiments and is not to be construed as limited to the specific embodiments disclosed, and that all such modifications to the disclosed embodiments, as well as other embodiments, are intended to be included within the scope of the present disclosure as defined by the appended claims.

What is claimed is:

1. A gate driver comprising:
   a plurality of active stages configured to output gate signals to a display part; and
   a plurality of pre-stages, connected to the active stages, configured to output carry signals to the active stages,
   wherein the pre-stages do not output the gate signals to the display part,
   wherein the pre-stages include a first pre-stage and a second pre-stage,
   wherein, among the active stages and the pre-stages, only the second pre-stage includes a Q node compensator configured to receive a clock signal from the first pre-stage and to compensate for a voltage of a Q node based on the clock signal of the first pre-stage,
   wherein the Q node compensator includes a feedback transistor configured to diode-connect a feedback input terminal, which is configured to receive the clock signal of the first pre-stage, to a feedback node of the second pre-stage.

2. The gate driver of claim 1,
   wherein the feedback transistor includes a first electrode, a second electrode, and a third electrode, the first electrode being connected to the feedback input terminal, the second electrode being connected to the first electrode, and the third electrode being connected to the feedback node,
   wherein the clock signal of the first pre-stage is one of a carry signal of the first pre-stage, a sensing signal of the first pre-stage, or a gate signal of the first pre-stage,
   wherein the second electrode of the feedback transistor is a gate electrode.

3. The gate driver of claim 1, wherein the Q node compensator is configured to adjust a level of a voltage applied to the feedback node to reduce a drain-source voltage of at least one of transistors configured to connect the feedback node to the Q node.

4. The gate driver of claim 3, wherein the second pre-stage includes:
   a Q node charger configured to receive a vertical start signal to charge the Q node;
   a Q node stabilizer configured to receive a carry signal of the active stage to stabilize the Q node; and
   an inverter configured to generate an inverting signal based on the voltage of the Q node.

5. The gate driver of claim 4, wherein the feedback node of the second pre-stage is connected to the Q node charger, the Q node stabilizer, and the inverter.

6. The gate driver of claim 4, wherein the second pre-stage includes a transistor stabilizer configured to stabilize a plurality of transistors connected to the feedback node based on a transistor stabilization signal,
   wherein the transistor stabilizer includes a first transistor stabilization transistor and a second transistor stabilization transistor,
   wherein the first transistor stabilization transistor includes a first electrode connected to the second transistor stabilization transistor, a second electrode connected to the Q node, and a third electrode connected to the feedback node, and
   wherein the second transistor stabilization transistor includes a first electrode to which a gate high voltage is applied, a second electrode connected to the Q node, and a third electrode connected to the first transistor stabilization transistor.

7. The gate driver of claim 4, wherein the Q node charger includes a first charging transistor and a second charging transistor,
   wherein the second charging transistor includes a first electrode configured to receive the vertical start signal, a second electrode connected to the first electrode, and a third electrode connected to the first charging transistor, and
   wherein the first charging transistor includes a first electrode connected to the second charging transistor, a second electrode connected to the first electrode of the second charging transistor, and a third electrode connected to the Q node.

8. The gate driver of claim 4, wherein the Q node stabilizer includes a first stabilization transistor and a second stabilization transistor,
   wherein the first stabilization transistor includes a first electrode connected to the second stabilization transistor, a second electrode to which one of next carry signals is applied, and a third electrode connected to the Q node, and
   wherein the second stabilization transistor includes a first electrode to which a first low voltage is applied, a second electrode to which one of the next carry signals is applied, and a third electrode connected to the first stabilization transistor.

9. The gate driver of claim 4, wherein each of the Q node charger, the Q node stabilizer, and the inverter includes an oxide semiconductor transistor.

10. The gate driver of claim 4, wherein the second pre-stage is configured to adjust the level of the voltage of the feedback node to reduce a leakage current of the transistor configured to connect the feedback node to the Q node, to generate a carry signal based on the voltage of the Q node, and to output the carry signal to the active stage.

11. A display device comprising:
    a display panel including a display part for displaying an image and a peripheral part adjacent to the display part;
    a data driver configured to apply a data voltage to the display panel; and
    a gate driver including a plurality of active stages configured to output gate signals to the display part, and a plurality of pre-stages, connected to the active stages, configured to output carry signals to the active stages,
    wherein the pre-stages do not output the gate signals to the display part,
    wherein the pre-stages include a first pre-stage and a second pre-stage,
    wherein, among the active stages and the pre-stages, only the second pre-stage includes a Q node compensator configured to receive a clock signal from the first pre-stage and to compensate for a voltage of a Q node based on the clock signal of the first pre-stage, wherein the Q node compensator includes a feedback transistor configured to diode-connect a feedback input terminal, which is configured to receive the clock signal of the first pre-stage, to a feedback node of the second pre-stage.

12. The display device of claim 11,
wherein the feedback transistor includes a first electrode, a second electrode, and a third electrode, the first electrode being connected to the feedback input terminal, the second electrode being connected to the first electrode, and the third electrode being connected to the feedback node,
wherein the clock signal of the first pre-stage is one of a carry signal of the first pre-stage, a sensing signal of the first pre-stage, or a gate signal of the first pre-stage,
wherein the second electrode of the feedback transistor is a gate electrode.

13. The display device of claim 11, wherein the Q node compensator is configured to adjust a level of a voltage applied to the feedback node to reduce a drain-source voltage of at least one of transistors configured to connect the feedback node to the Q node.

14. The display device of claim 13, wherein the second pre-stage includes:
a Q node charger configured to receive a vertical start signal to charge the Q node;
a Q node stabilizer configured to receive a carry signal of the active stage to stabilize the Q node; and
an inverter configured to generate an inverting signal based on the voltage of the Q node.

15. The display device of claim 14, wherein the feedback node of the second pre-stage is connected to the Q node charger, the Q node stabilizer, and the inverter.

16. The display device of claim 14, wherein the second pre-stage includes a transistor stabilizer configured to stabilize a plurality of transistors connected to the feedback node based on a transistor stabilization signal,
wherein the transistor stabilizer includes a first transistor stabilization transistor and a second transistor stabilization transistor,
wherein the first transistor stabilization transistor includes a first electrode connected to the second transistor stabilization transistor, a second electrode connected to the Q node, and a third electrode connected to the feedback node, and
wherein the second transistor stabilization transistor includes a first electrode to which a gate high voltage is applied, a second electrode connected to the Q node, and a third electrode connected to the first transistor stabilization transistor.

17. The display device of claim 14, wherein the Q node charger includes a first charging transistor and a second charging transistor,
wherein the second charging transistor includes a first electrode configured to receive the vertical start signal, a second electrode connected to the first electrode, and a third electrode connected to the first charging transistor, and
wherein the first charging transistor includes a first electrode connected to the second charging transistor, a second electrode connected to the first electrode of the second charging transistor, and a third electrode connected to the Q node.

18. The display device of claim 14, wherein the Q node stabilizer includes a first stabilization transistor and a second stabilization transistor,
wherein the first stabilization transistor includes a first electrode connected to the second stabilization transistor, a second electrode to which one of next carry signals is applied, and a third electrode connected to the Q node, and
wherein the second stabilization transistor includes a first electrode to which a first low voltage is applied, a second electrode to which one of the next carry signals is applied, and a third electrode connected to the first stabilization transistor.

19. The display device of claim 14, wherein each of the Q node charger, the Q node stabilizer, and the inverter includes an oxide semiconductor transistor.

20. The display device of claim 14, wherein the second pre-stage is configured to adjust the level of the voltage of the feedback node to reduce a leakage current of the transistor configured to connect the feedback node to the Q node, to generate a carry signal based on the voltage of the Q node, and to output the carry signal to the active stage.

21. A method of driving a display device, the method comprising:
outputting gate signals from a plurality of active stages to a display part of the display device; and
outputting carry signals from a plurality of pre-stages to the plurality of active stages,
wherein the pre-stages do not output the gate signals to the display part,
wherein the pre-stages include a first pre-stage and a second pre-stage,
wherein, among the active stages and the pre-stages, only the second pre-stage includes a Q node compensator configured to receive a clock signal from the first pre-stage and to compensate for a voltage of a Q node based on the clock signal of the first pre-stage,
wherein the Q node compensator includes a feedback transistor configured to diode-connect a feedback input terminal, which is configured to receive the clock signal of the first pre-stage, to a feedback node of the second pre-stage.

* * * * *